(12) United States Patent
Chen

(10) Patent No.: US 11,335,842 B2
(45) Date of Patent: May 17, 2022

(54) CHIP-SCALE PACKAGING LIGHT-EMITTING DEVICE WITH ELECTRODE POLARITY IDENTIFIER AND METHOD OF MANUFACTURING THE SAME

(71) Applicant: MAVEN OPTRONICS CO., LTD., Hsinchu County (TW)

(72) Inventor: Chieh Chen, Palo Alto, CA (US)

(73) Assignee: Maven Optronics CO., LTD., Hsinchu County (TW)

( * ) Notice: Subject to any disclaimer, the term of this patent is extended or adjusted under 35 U.S.C. 154(b) by 64 days.

(21) Appl. No.: 16/275,168

(22) Filed: Feb. 13, 2019

(65) Prior Publication Data

US 2019/0252587 A1    Aug. 15, 2019

(30) Foreign Application Priority Data

Feb. 14, 2018    (CN) .......................... 201810152166.3
Feb. 14, 2018    (TW) ................................. 107105605

(51) Int. Cl.
*H01L 33/62*    (2010.01)
*H01L 33/50*    (2010.01)
*H01L 33/60*    (2010.01)

(52) U.S. Cl.
CPC ............ *H01L 33/62* (2013.01); *H01L 33/502* (2013.01); *H01L 33/60* (2013.01);
(Continued)

(58) Field of Classification Search
CPC ....... H01L 33/62; H01L 33/502; H01L 33/60; H01L 2933/0033; H01L 2933/0041; H01L 2933/0058; H01L 2933/0066
See application file for complete search history.

(56) References Cited

U.S. PATENT DOCUMENTS

| 10,418,413 | B1* | 9/2019 | Ellis | ........................ | H01L 24/95 |
| 2012/0098006 | A1* | 4/2012 | Chen | ....................... | H01L 24/97 |
| | | | | | 257/98 |

(Continued)

FOREIGN PATENT DOCUMENTS

| CN | 104823290 A | 8/2015 |
| CN | 104854716 A | 8/2015 |

(Continued)

OTHER PUBLICATIONS

Office Action for corresponding Taiwan Patent Application No. 107105605, dated Jun. 14, 2018, 7 pages.

(Continued)

*Primary Examiner* — Peter Bradford
(74) *Attorney, Agent, or Firm* — Foley & Lardner LLP

(57) ABSTRACT

A chip-scale packaging (CSP) light-emitting device (LED) is provided with an electrode polarity identifier, and includes a light-emitting semiconductor chip and a packaging structure. A first horizontal direction and a perpendicular second horizontal direction are specified on a semiconductor-chip-upper surface. The packaging structure covers the semiconductor-chip-upper surface, a first semiconductor-chip-side surface and a second semiconductor-chip-side surface of the light-emitting semiconductor chip, and includes a first package-side surface and a second package-side surface. A first region is between the first package-side surface and the first semiconductor-chip-side surface, and a second region is between the second package-side surface and the second semiconductor-chip-side surface, wherein an area of the first region is different from an area of the second region. An orientation of the electrode polarity of the CSP LED can be visually identified by recognizing the area difference of the first region and the second region.

13 Claims, 12 Drawing Sheets

(52) U.S. Cl.
CPC .............. *H01L 2933/0033* (2013.01); *H01L 2933/0041* (2013.01); *H01L 2933/0058* (2013.01); *H01L 2933/0066* (2013.01)

(56) References Cited

U.S. PATENT DOCUMENTS

| | | | |
|---|---|---|---|
| 2013/0033838 A1* | 2/2013 | Sato | H01L 23/49838 361/777 |
| 2015/0085527 A1* | 3/2015 | Nam | H01L 33/505 362/612 |
| 2015/0200338 A1 | 7/2015 | Kim et al. | |
| 2015/0311405 A1* | 10/2015 | Oyamada | H01L 33/60 257/98 |
| 2015/0316215 A1* | 11/2015 | Togawa | H01L 33/505 362/231 |
| 2016/0225959 A1* | 8/2016 | Pan | H01L 33/54 |
| 2016/0306101 A1* | 10/2016 | Lee | H01L 33/505 |
| 2016/0329469 A1* | 11/2016 | Langer | H05K 1/188 |
| 2017/0062663 A1* | 3/2017 | Hayashi | H01L 33/62 |
| 2017/0108173 A1* | 4/2017 | Kim | G06F 1/1662 |
| 2017/0155021 A1* | 6/2017 | Fukuda | H01L 33/62 |
| 2017/0194540 A1* | 7/2017 | Liu | H01L 33/60 |
| 2018/0033933 A1* | 2/2018 | Hishiki | H01L 33/60 |
| 2018/0182695 A1* | 6/2018 | Kataoka | H01L 23/49838 |
| 2018/0212118 A1 | 7/2018 | Chen et al. | |
| 2018/0261723 A1* | 9/2018 | Jang | H01L 33/38 |
| 2018/0331266 A1* | 11/2018 | Kobayakawa | H01L 27/0248 |
| 2019/0051802 A1* | 2/2019 | Perzlmaier | H01L 33/0095 |
| 2019/0097109 A1* | 3/2019 | Zhang | H01L 33/644 |
| 2019/0165226 A1* | 5/2019 | Kim | H01L 33/486 |
| 2019/0221727 A1* | 7/2019 | Hayashi | H01L 33/60 |
| 2020/0048546 A1* | 2/2020 | Kanzaki | G02B 5/26 |

FOREIGN PATENT DOCUMENTS

| | | |
|---|---|---|
| CN | 206271751 U | 6/2017 |
| CN | 107105605 A | 8/2017 |
| TW | 201528542 A | 7/2015 |
| TW | 201714330 A | 4/2017 |
| TW | I599078 B | 9/2017 |
| WO | WO-2017/191966 A1 | 11/2017 |
| WO | WO-2019018193 A1 * | 1/2019 ............ H01L 33/62 |

OTHER PUBLICATIONS

Search Report from corresponding Taiwan Patent Application No. 107105605, dated Jun. 14, 2018, 1 page.

* cited by examiner

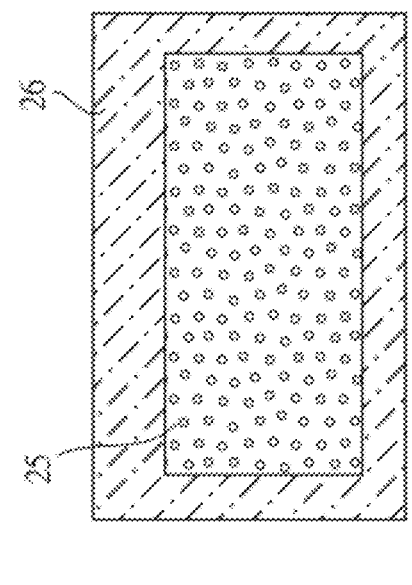
FIG. 3A
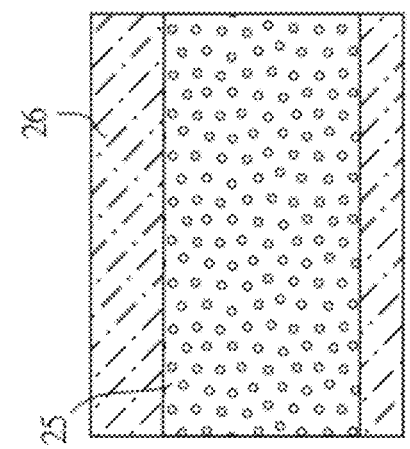
FIG. 3B
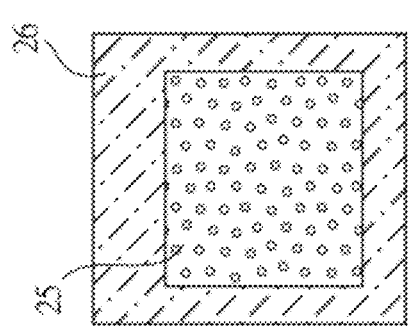
FIG. 3C
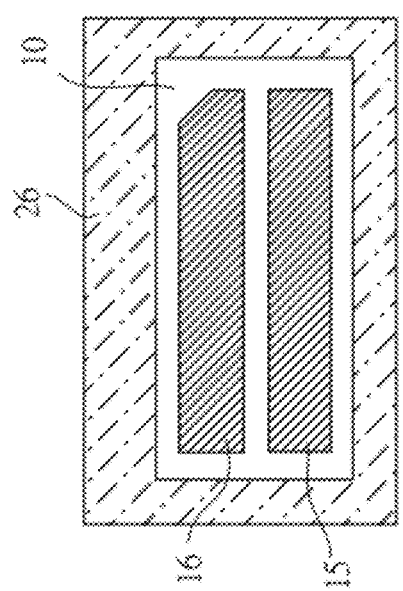
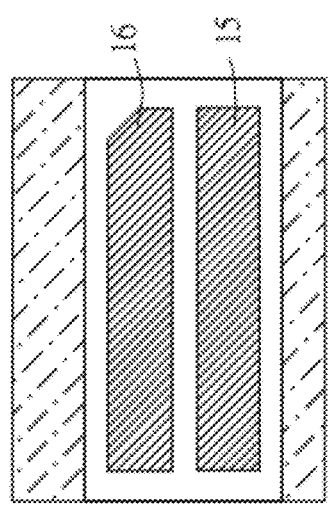
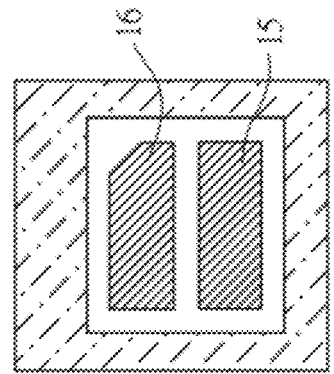

CHIP-SCALE PACKAGING LIGHT-EMITTING DEVICE WITH ELECTRODE POLARITY IDENTIFIER AND METHOD OF MANUFACTURING THE SAME

CROSS-REFERENCES TO RELATED APPLICATIONS

This application claims the benefit of and priority to Taiwan Patent Application No. 107105605 filed on Feb. 14, 2018, and Chinese Patent Application No. 201810152166.3 filed on Feb. 14, 2018, the disclosures of which are incorporated herein by reference in their entirety.

BACKGROUND

Technical Field

The present disclosure relates to a light-emitting device and a method of fabricating the same, and more particularly to a chip-scale packaging (CSP) light-emitting device (LED) with an electrode polarity identifier and a method of manufacturing the same.

Description of the Related Art

Light-emitting semiconductor chips are used as light sources to provide general illumination, backlight for liquid crystal display (LCD) panels, or as operation indicators for electronic devices, and light-emitting semiconductor chips are typically disposed in various package configurations (which may include phosphor materials inside packages) to become (white) LEDs.

With the development of LED technology, CSP LEDs have received much attention in recent years due to their advantages. Compared with a plastic leaded chip carrier (PLCC)-type LED package with a lead frame or an LED package with a ceramic submount, a CSP LED has the following advantages. (1) allows omitting using a gold wire and an additional submount made of either a lead frame or a ceramic substrate, thereby significantly saving materials cost. (2) Since a submount such as a lead frame or a ceramic substrate is omitted, the thermal resistance between the light-emitting semiconductor chip and the application board can be further reduced, so that under the same operating currents, the operating temperature (the chip junction temperature) will be lower. Alternatively, the operating power can be increased under the same operating temperature. (3) A lower operating temperature allows the light-emitting semiconductor chip to have higher internal quantum efficiency. (4) A greatly reduced package size allows for more design flexibility and facilitates designing various embedded lighting application modules or luminaires. (5) Since a CSP LED has a smaller light radiation surface area, therefore, the etendue of a CSP light source can be reduced, making the secondary optics easier to design. A lighting application with a higher luminous intensity, such as an automotive headlight, can also be achieved using a light source with a reduced etendue.

However, since a CSP LED has a small form factor and does not use an additional submount such as a ceramic submount, a printed circuit board (PCB) submount or a lead frame, an anode and a cathode of a light-emitting semiconductor chip cannot be readily distinguished from the appearance and the orientation of a CSP LED, either viewed from the top side or viewed from the bottom side. Specifically, if viewed directly from the top side of a CSP LED, the appearance usually is of a symmetrical shape; if viewed directly from the bottom side of a CSP LED, the exposed electrode pads of a light-emitting semiconductor chip are too small to readily identify the polarity. It is therefore difficult to determine the orientation of the anode and cathode of the light-emitting semiconductor chip disposed inside the CSP LED either by human eyes or by machine vision. Even though the orientation of the anode and cathode can be identified when a CSP LED is viewed from the bottom side using a high-magnification lens for machine vision, it slows down the manufacturing throughput and involves tedious manufacturing processes during a welding procedure to assemble CSP LEDs on application boards, such as flipping, arranging, and soldering CSP LEDs to the PCB, resulting in a low manufacturing efficiency of the welding procedure. Further, once a CSP LED is arranged and disposed on the circuit board, it is difficult to identify the orientation of the anode and cathode from its appearance, and it is difficult to recognize whether the orientations of the CSP LEDs electrodes are correctly placed on the circuit board.

Other approaches are proposed to identify the orientation of the electrode polarity of a CSP LED when it is viewed from the top side. For example, a recessed line mark, a concave groove mark or the like is formed on the top surface of a CSP LED, e.g., a phosphor layer, and then a material of a different color is refilled into the recessed line mark or the concave groove mark on the phosphor layer so that an identification mark is created, which can be used to identify the orientation of the electrode polarity. However, since the surface area of the phosphor layer of a CSP LED itself is already small, it is difficult to form an even finer recessed line mark or concave groove mark on the layer. Moreover, a manufacturing process and equipment of finer precision is involved to make the extremely small recessed line mark or the concave groove mark. It is even more difficult to refill other materials to the recessed line mark or the concave groove mark due to the extremely small size of the recessed line mark or the concave groove mark. Furthermore, the uncured filler material is difficult to flow into the recessed line mark or the concave groove mark, so that the filler material does not adequately fill up the concave groove mark in a flush manner, or the filler material overflows outside the concave groove mark. Therefore, in addition to complicating the manufacturing process of a CSP LED with increased manufacturing costs, the manufacturing yield of forming a recessed line mark or a concave groove mark and refilling of coloring materials will be greatly reduced.

In view of the above-mentioned shortcomings, an efficient solution to identify the orientation of the electrode polarity of a CSP LED remains desired in the LED industry.

SUMMARY

An object of some embodiments of the present disclosure is to provide a CSP LED having an electrode polarity identifier which can be used to recognize the orientation of the electrode polarity, and a manufacturing method thereof, wherein the manufacturing yield to fabricate the CSP LED with an electrode polarity identifier is not adversely affected.

In order to achieve the above object, a CSP LED of some embodiments is disclosed comprising a light-emitting semiconductor chip and a packaging structure. Specifically, the light-emitting semiconductor chip of the CSP LED comprises a semiconductor-chip-upper surface, a semiconductor-chip-lower surface opposite to the semiconductor-chip-upper surface, a first semiconductor-chip-side surface, a second semiconductor-chip-side surface, a first electrode and a second electrode, wherein the first semiconductor-chip-side surface and the second semiconductor-chip-side surface extend between the semiconductor-chip-upper surface and the semiconductor-chip-lower surface, and the first electrode and the second electrode are disposed adjacent to the semiconductor-chip-lower surface. A first horizontal direction and a perpendicular second horizontal direction are specified on the semiconductor-chip-upper surface, and the first semiconductor-chip-side surface and the second semiconductor-chip-side surface are disposed apart along the first horizontal direction. Furthermore, the packaging structure of the CSP LED is configured to cover the semiconductor-chip-upper surface, the first semiconductor-chip-side surface and the second semiconductor-chip-side surface, but to expose the semiconductor-chip-lower surface, the first electrode and the second electrode of the light-emitting semiconductor chip. Specifically, the packaging structure comprises a first packaging-structure-side surface and a second packaging-structure-side surface disposed apart along the first horizontal direction. More specifically, along the first horizontal direction, a first region is between the first packaging-structure-side surface and the first semiconductor-chip-side surface of the CSP LED, and a second region is between the second packaging-structure-side surface and the second semiconductor-chip-side surface of the CSP LED, wherein an area of the first region is different from an area of the second region.

In some embodiments, along the first horizontal direction, a first package-length between the first packaging-structure-side surface and the first semiconductor-chip-side surface is specified to be smaller than a second package-length between the second packaging-structure-side surface and the second semiconductor-chip-side surface, so that the area of the first region is smaller than the area of the second region.

In some embodiments, a shape of the first region is different from a shape of the second region.

In some embodiments, along the second horizontal direction, a first package-width of the first packaging-structure-side surface is greater than a second package-width of the second packaging-structure-side surface and greater than a semiconductor-chip-width of the second semiconductor-chip-side surface such that the area of the first region is larger than the area of the second region.

In some embodiments, the packaging structure further comprises a third packaging-structure-side surface and a fourth packaging-structure-side surface disposed apart along the second horizontal direction, and a chamfered packaging-structure-side surface, wherein the chamfered packaging-structure-side surface is connected between the second packaging-structure-side surface and the third packaging-structure-side surface.

In order to achieve the above object, another CSP LED of some embodiments is disclosed comprising a light-emitting semiconductor chip and a packaging structure. Specifically, the light-emitting semiconductor chip of the CSP LED comprises a semiconductor-chip-upper surface, a semiconductor-chip-lower surface opposite to the semiconductor-chip-upper surface, a first semiconductor-chip-side surface, and a second semiconductor-chip-side surface, wherein the first semiconductor-chip-side surface and the second semiconductor-chip-side surface extend between the semiconductor-chip-upper surface and the semiconductor-chip-lower surface, and the first electrode and the second electrode are disposed adjacent to the semiconductor-chip-lower surface. A first horizontal direction and a perpendicular second horizontal direction are specified on the semiconductor-chip-upper surface, and the first semiconductor-chip-side surface and the second semiconductor-chip-side surface are disposed apart along the first horizontal direction. Furthermore, the packaging structure of the CSP LED is configured to cover the semiconductor-chip-upper surface, the first semiconductor-chip-side surface and the second semiconductor-chip-side surface, but to expose the semiconductor-chip-lower surface, the first electrode and the second electrode of the light-emitting semiconductor chip. The packaging structure further comprises a photoluminescent layer and a reflective structure. The photoluminescent layer is disposed on the semiconductor-chip-upper surface of the light-emitting semiconductor chip, and comprises a first photoluminescent-layer-side surface and a second photoluminescent-layer-side surface disposed apart along the first horizontal direction. The reflective structure at least covers the semiconductor-chip-side surfaces of the light-emitting semiconductor chip and the photoluminescent-layer-side surfaces along the first horizontal direction. The reflective structure includes a first reflective-structure-side surface and a second reflective-structure-side surface disposed apart along the first horizontal direction. Along the first horizontal direction, a first region is between the first reflective-structure-side surface and the first photoluminescent-layer-side surface, and a second region is between the second reflective-structure-side surface and the second photoluminescent-layer-side surface, wherein an area of first region is different from an area of the second region.

In some embodiments, along the first horizontal direction, a third package-length between the first reflective-structure-side surface and the first photoluminescent-layer-side surface is specified to be smaller than a fourth package-length between the second reflective-structure-side surface and the second photoluminescent-layer-side surface.

In order to achieve the above object, a method of manufacturing a CSP LED according to some embodiments of the present disclosure includes two main fabrication stages: providing a plurality of light-emitting semiconductor chips; and forming a plurality of packaging structures on the light-emitting semiconductor chips. Specifically, each of the light-emitting semiconductor chips includes a semiconductor-chip-upper surface, a semiconductor-chip-lower surface opposite to the semiconductor-chip-upper surface, a first semiconductor-chip-side surface, a second semiconductor-chip-side surface, a first electrode and a second electrode, wherein the first semiconductor-chip-side surface and the second semiconductor-chip-side surface extend between the semiconductor-chip-upper surface and the semiconductor-chip-lower surface, wherein the first semiconductor-chip-side surface and the second semiconductor-chip-side surface are disposed apart along the first horizontal direction. More specifically, forming the plurality of packaging structures on the light-emitting semiconductor chips is specified to cover each of the semiconductor-chip-upper surface, the first semiconductor-chip-side surface and the second semiconductor-chip-side surface of the light-emitting semiconductor chip, but to expose the semiconductor-chip-lower surface, the first electrode and the second electrode, wherein the packaging structure includes a first packaging-structure-side surface and a second packaging-structure-side surface disposed apart along the first horizontal direction. A first region is between the first packaging-structure-side surface and the first semiconductor-chip-side surface, and a second region is between the second packaging-structure-side surface and the second semiconductor-chip-side surface, wherein an area of the first region is different from an area of the second region.

Thereby, the CSP LED and the manufacturing method thereof disclosed according to some embodiments of the present disclosure can provide at least the following technical benefits. (1). When viewed from the top side or the bottom side of a CSP LED, the CSP LED exhibits a first region and a second region of different area sizes and has an asymmetric appearance of the different area sizes, whereby the asymmetric regions can be readily recognized visually by human eyes or machine vision so that an orientation of the electrode polarity can be identified. (2). The feature of asymmetric appearance exhibited by the CSP LED with an electrode polarity identifier can be readily fabricated using a single singulation manufacturing process such as cutting or molding. Because the singulation process is an already-included manufacturing stage to fabricate a CSP LED without an electrode polarity identifier, no additional manufacturing stage is added. Therefore, the manufacturing yield and the manufacturing cost to fabricate a CSP LED with an electrode polarity identifier are not affected. (3). The asymmetric appearance feature exhibited by the CSP LED with an electrode polarity identifier can be achieved without additionally including or injecting an additional amount of filler materials, and thus does not affect the manufacturing yield of the CSP LED. (4). When the packaging structure of a CSP LED with an electrode polarity identifier comprises a photoluminescent layer and a reflective structure, and the reflective structure is specified to cover the light-emitting semiconductor chip and the photoluminescent layer along a first horizontal direction, the first region and the second region of different area sizes can be specified on the reflective structure. Therefore, the difference in the area between the first region and the second region can be achieved by specifying different thicknesses of the reflective structure, so that the shape of the photoluminescent layer is still specified to be symmetrical and the optical characteristics of the LED are not affected accordingly. In other words, the appearance of a CSP LED with an electrode polarity identifier can be asymmetrical; however, the shape of the photoluminescent layer still has a symmetrical appearance. Because the photoluminescant layer is specified for wavelength and color conversion and the reflective structure is specified to provide a reflective surface, the light radiation pattern is not affected by the appearance of the asymmetric reflective structure after the primary light radiated by the light-emitting semiconductor chip passes through the photoluminescent layer.

Other aspects and embodiments of the disclosure are also contemplated. The foregoing summary and the following detailed description are not meant to restrict the disclosure to any particular embodiment but are merely meant to describe some embodiments of the disclosure.

BRIEF DESCRIPTION OF THE DRAWINGS

FIG. 3A to FIG. 3C are respectively a top view and a bottom view of other embodiments of the CSP LED illustrated in FIG. 1.

DETAILED DESCRIPTION

Definitions

Figure 1:
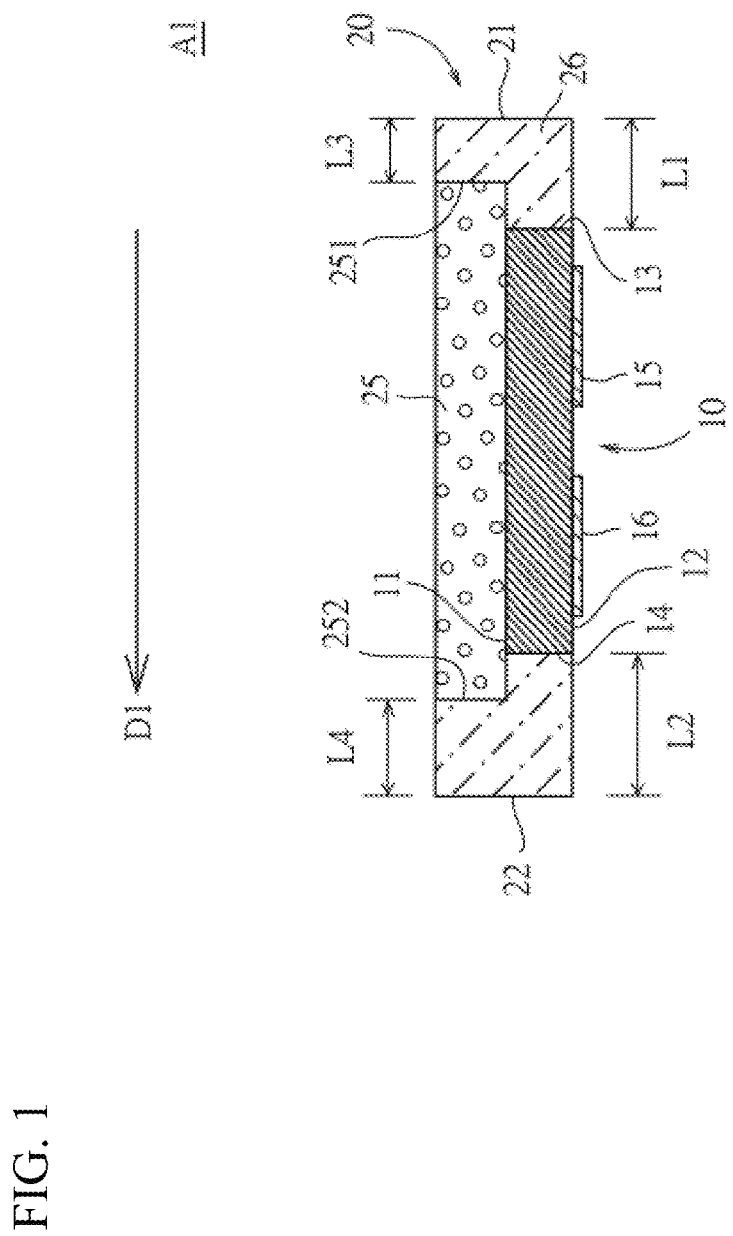
FIG. 1 is a schematic cross-sectional view of a CSP LED in accordance with an embodiment of the present disclosure.

The following definitions apply to some of the technical aspects described with respect to some embodiments of the disclosure. These definitions may likewise be expanded upon herein.

As used herein, the singular terms "a," "an," and "the" may include plural referents unless the context clearly dictates otherwise. Thus, for example, reference to a layer can include multiple layers unless the context clearly dictates otherwise.

As used herein, the term "set" refers to a collection of one or more components. Thus, for example, a set of layers can include a single layer or multiple layers. Components of a set also can be referred to as members of the set. Components of a set can be the same or different. In some instances, components of a set can share one or more common characteristics.

As used herein, the term "adjacent" refers to being near or adjoining. Adjacent components can be spaced apart from one another or can be in actual or direct contact with one another. In some instances, adjacent components can be connected to one another or can be formed integrally with one another. In the description of some embodiments, a component provided "on" or "on top of" another component can encompass cases where the former component is directly on (e.g., in direct physical contact with) the latter component, as well as cases where one or more intervening components are located between the former component and the latter component. In the description of some embodiments, a component provided "underneath" another component can encompass cases where the former component is directly beneath (e.g., in direct physical contact with) the latter component, as well as cases where one or more intervening components are located between the former component and the latter component.

As used herein, the terms "connect," "connected," and "connection" refer to an operational coupling or linking. Connected components can be directly coupled to one another or can be indirectly coupled to one another, such as via another set of components.

As used herein, the terms "about", "substantially", and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical tolerance levels of the manufacturing operations described herein. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" transparent can refer to a light transmittance of at least 70%, such as at least 75%, at least 80%, at least 85% or at least 90%, over at least a portion or over an entirety of the visible spectrum. For example, "substantially" flush can refer to two surfaces within 20 micrometers of lying along a same plane, such as within 10 micrometers of lying along the same plane, or within 5 micrometers of lying along the same plane. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±10, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±10, less than or equal to ±0.5°, less than or equal to ±0.1°, or less than or equal to ±0.05°.

As used herein with respect to photoluminescence, the term "efficiency" or "quantum efficiency" refers to a ratio of the number of output photons to the number of input photons.

As used herein, the term "size" refers to a characteristic dimension. In the case of an object (e.g., a particle) that is spherical, a size of the object can refer to a diameter of the object. In the case of an object that is non-spherical, a size of the non-spherical object can refer to a diameter of a corresponding spherical object, where the corresponding spherical object exhibits or has a particular set of derivable or measurable characteristics that are substantially the same as those of the non-spherical object. When referring to a set of objects as having a particular size, it is contemplated that the objects can have a distribution of sizes around that size. Thus, as used herein, a size of a set of objects can refer to a typical size of a distribution of sizes, such as an average size, a median size, or a peak size.

Figure 2B:
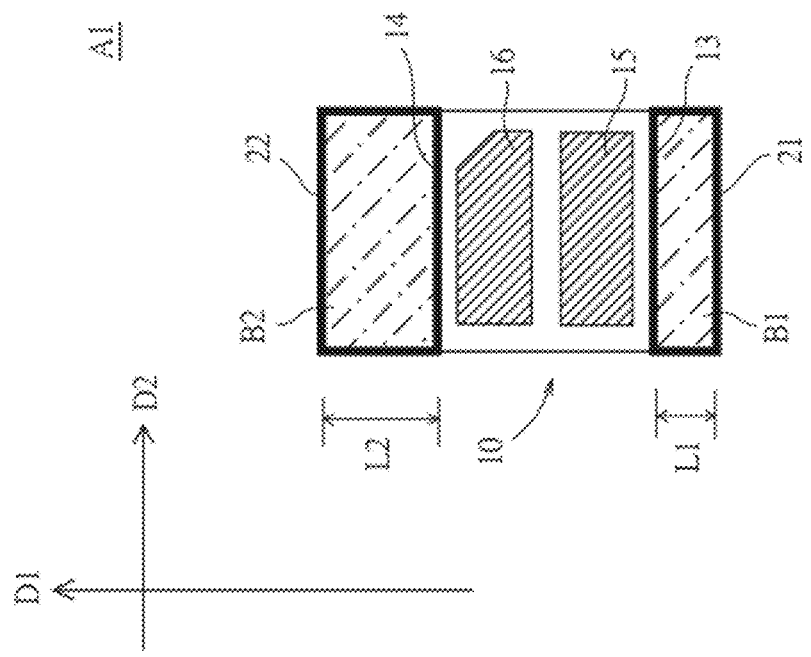
FIG. 2A and FIG. 2B are respectively a top view and a bottom view of the CSP LED illustrated in FIG. 1.
Figure 2A:
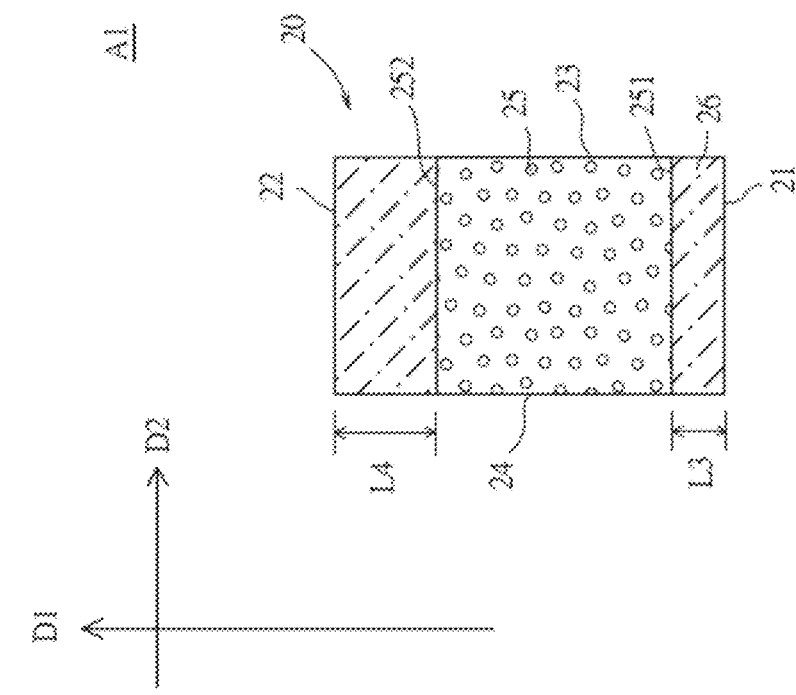

FIG. 1, FIG. 2A, and FIG. 2B are schematic diagrams of a CSP LED A1 according to an embodiment of the present disclosure. The CSP LED A1 includes a light-emitting semiconductor chip 10 and a packaging structure 20. The technical details of each component are described below in order.

The light-emitting semiconductor chip 10 can be a flip-chip light-emitting semiconductor chip, which is configured to emit a primary light such as a red light, a green light, a blue light, an infrared (IR) light or an ultraviolet (UV) light, and the light-emitting semiconductor chip 10 has a semiconductor-chip-upper surface 11, a semiconductor-chip-lower surface 12 opposite to the semiconductor-chip-upper surface 11, a first semiconductor-chip-side surface 13, a second semiconductor-chip-side surface 14, a first electrode 15 and a second electrode 16. The semiconductor-chip-upper surface 11 and the semiconductor-chip-lower surface 12 are substantially parallel and oppositely disposed, and both of them may be of a square shape or of a rectangular shape. A first horizontal direction $D_1$ is specified to be parallel with one pair of edge lines of the semiconductor-chip-upper surface 11 (and also the semiconductor-chip-lower surface 12); and a second horizontal direction $D_2$ is specified to be parallel with another pair of the edge lines. In other words, the first horizontal direction $D_1$ and the perpendicular second horizontal direction $D_2$ are specified on the semiconductor-chip-upper surface 11 of the light-emitting semiconductor chip 10, and the direction of the optical axis associated with the light-emitting semiconductor chip 10 (e.g., the direction perpendicular to the semiconductor-chip-upper surface 11) is perpendicular to the first horizontal direction $D_1$ as well as the second horizontal direction $D_2$.

The first semiconductor-chip-side surface 13 and the second semiconductor-chip-side surface 14 extend between the semiconductor-chip-upper surface 11 and the semiconductor-chip-lower surface 12, and connect the semiconductor-chip-upper surface 11 and the semiconductor-chip-lower surface 12. The first semiconductor-chip-side surface 13 and the second semiconductor-chip-side surface 14 are spaced apart along the first horizontal direction $D_1$. That is, each of the semiconductor-chip-side surfaces 13 and 14 is located on the opposite side of the light-emitting semiconductor chip 10 facing each other. The light-emitting semiconductor chip 10 includes two other semiconductor-chip-side surfaces (not numbered) that also connect the semiconductor-chip-upper surface 11 to the semiconductor-chip-lower surface 12 and are spaced apart along the second horizontal direction $D_2$.

As shown in FIG. 2B, the first electrode 15 and the second electrode 16 are disposed adjacent to or on the semiconductor-chip-lower surface 12. Hereinafter, the first electrode 15 and the second electrode 16 together with the semiconductor-chip-lower surface 12 are collectively referred to as a lower electrode surface. The first electrode 15 and the second electrode 16 may be spaced apart along the first horizontal direction $D_1$. Alternatively, the first electrode 15 and the second electrode 16 may also be spaced apart along the second horizontal direction $D_2$. One of the first electrode 15 and the second electrode 16 can function as an anode and the other can function as a cathode. The first electrode 15 and the second electrode 16 can have different (e.g., opposite) electrode polarity.

The packaging structure 20 can be a light-transmitting structure without wavelength conversion of the primary light emitted by the light-emitting semiconductor chip 10. Alternatively, the packaging structure 20 can down-convert the wavelength of a portion of the primary light emitted by the light-emitting semiconductor chip 10. Alternatively, the packaging structure 20 can shape a radiation pattern of the light beam, the light beam viewing angle, and the like of the CSP LED A1. The packaging structure 20 is specified to cover the semiconductor-chip-upper surface 11 of the light-emitting semiconductor chip 10, the first semiconductor-chip-side surface 13 and the second semiconductor-chip-side surface 14, but to expose the semiconductor-chip-lower surface 12, the first electrode 15 and the second electrode 16. In other words, the packaging structure 20 does not cover the lower electrode surface of the light-emitting semiconductor chip 10, so that it will not hinder soldering the first electrode 15 and the second electrode 16 to a circuit board (not shown) during a surface mounting process of the CSP LED A1. In addition, in this embodiment, the packaging structure 20 also covers the other two semiconductor-chip-side surface (not numbered) of the light-emitting semiconductor chip 10 that are disposed apart along the second horizontal direction $D_2$.

As shown in FIG. 2B, in appearance, the packaging structure 20 includes a first packaging-structure-side surface 21 (hereinafter also referred to as a first package-side surface 21) and a second packaging-structure-side surface 22 (hereinafter also referred to as a second package-side surface 22) disposed apart along the first horizontal direction $D_1$. A third packaging-structure-side surface 23 (hereinafter also referred to as a third package-side surface 23) and a fourth packaging-structure-side surface 24 (hereinafter also referred to as a fourth package-side surface 24) are provided and disposed apart along the second horizontal direction $D_2$. A first region $B_1$ is specified between the first package-side surface 21 of the packaging structure 20 and the first semiconductor-chip-side surface 13 of the light-emitting semiconductor chip 10 along the first horizontal direction $D_1$, and a second region $B_2$ is specified between the second package-side surface 22 and the second semiconductor-chip-side surface 14, wherein an area of the first region $B_1$ is specified to be different from, or not equal to, an area of the second region $B_2$, and the first region $B_1$ and the second region $B_2$ of unequal areas can be used an identifier to represent the orientation of the electrode polarity. That is, from a top view or a bottom view, the first region $B_1$ is a two-dimensional region specified by projecting a portion of the packaging structure 20 between the first package-side surface 21 and the first semiconductor-chip-side surface 13 onto a plane; and the second region $B_2$ is a two-dimensional region specified by projecting a portion of the packaging structure 20 between the second package-side surface 22 and the second semiconductor-chip-side surface 14 onto the same plane. Specifically, the area of the first region $B_1$ and the area of the second region $B_2$ are specified to be different. For example, the area of the second region $B_2$ is larger than the area of the first region $B_1$ (for example, at least about 1.2 times, at least about 1.3 times, at least about 1.5 times, or even up to about 2 times or more, or other non-integer or integer multiples). Therefore, the difference of the first region $B_1$ and the second region $B_2$ can be readily identified visually by human eyes or by machine vision. The orientation of the electrode polarity, e.g., the arrangement of the first electrode 15 and the second electrode 16 can be further recognized by the orientation of the first region $B_1$ and the second region $B_2$.

The electrode polarity identifier characterized by unequal areas of the first region $B_1$ and the second region $B_2$ can be achieved by specifying different lengths of the packaging structure 20. Specifically, as illustrated in FIG. 2B, the packaging structure 20 includes a first characteristic length and a second characteristic length. More specifically, the first characteristic length is a package-length $L_1$ specified between the first package-side surface 21 and the first semiconductor-chip-side surface 13 along the first horizontal direction $D_1$ (hereinafter also referred to as the first package-length $L_1$), and the second characteristic length is a package-length $L_2$ specified between the second package-side surface 22 and the second semiconductor-chip-side surface 14 (hereinafter also referred to as the second package-length $L_2$), wherein the first package-length $L_1$ is specified to be smaller than the second package-length $L_2$. The area of the first region $B_1$ is therefore smaller than the area of the second region $B_2$ (the first package-width and the second package-width of the two regions $B_1$, $B_2$ are specified to be substantially the same). For example, the second package-length $L_2$ may be at least about 1.2 times, at least about 1.3 times, at least about 1.5 times, or up to about 2 times or more of the first package-length $L_1$, or other non-integer or integer multiples so that the difference in package-lengths can be readily distinguished visually by human eyes or by machine vision.

The packaging structure 20 may comprise at least one of the following components: a photoluminescent layer, a reflective structure, a light guide structure, a light-transmitting layer, a moisture barrier layer, a moisture absorbing layer, and/or a buffer layer. Furthermore, the electrode polarity identifier specified on the packaging structure 20 should not be limited to the above-mentioned components of the packaging structure 20. This technical feature to incorporate an electrode polarity identifier on a packaging structure can be applied to, for example, various embodiments of CSP LEDs as disclosed in the U.S. patent application Ser. No. 16/112,381, filed Aug. 24, 2018, U.S. patent application Ser. No. 15/877,329 (published as US 2018/0212118), US patent application Ser. No. 15/423,513 (published as US 2017/0229621), U.S. patent application Ser. No. 15/416,921 (published as US 2017/0222107), U.S. patent application Ser. No. 15/402,087 (published as US 2017/0200870), U.S. patent application Ser. No. 15/389,417 (published as US 2017/0194538), U.S. patent application Ser. No. 15/280,927 (published as US 2017/0098743), and U.S. patent application Ser. No. 15/665,280 (published as US 2018/0040786). The packaging structure or the packaging component covering the light-emitting semiconductor chip disclosed in these patent applications can include the technical feature of an electrode polarity identifier characterized by two regions of unequal areas (or other embodiments described later) to provide asymmetry in appearance visually. The technical content of these patent applications are incorporated herein by reference, and can be incorporated into the present disclosure as various embodiments of the packaging structure 20.

In the illustrated embodiment, the packaging structure 20 includes a photoluminescent layer 25 and a reflective structure 26. The photoluminescent layer 25 may include a phosphor material (or a quantum dot material) that is mixed in a light-transmitting resin material to partially down-convert the wavelength of the primary light emitted from the light-emitting semiconductor chip 10 to generate a secondary light of a longer wavelength. A method of forming a phosphor layer is disclosed in U.S. Pat. No. 9,797,041. An area of the photoluminescent layer 25 is greater than or substantially equal to an upper surface area of the semiconductor-chip-upper surface 11 of the light-emitting semiconductor chip 10, and is symmetrically and concentrically disposed on the semiconductor-chip-upper surface 11 of the light-emitting semiconductor chip 10. If the area of the photoluminescent layer 25 is larger than the upper surface area of the light-emitting semiconductor chip 10, along the first horizontal direction $D_1$, the photoluminescent layer 25 comprises a first photoluminescent-layer-side surface 251 (hereinafter also referred to as a first PL-side surface 251) and a second photoluminescent-layer-side surface 252 (hereinafter also referred to as a second PL-side surface 252), wherein the first PL-side surface 251 and the second PL-side surface 252 are substantially equally spaced apart from the first semiconductor-chip-side surface 13 and the second semiconductor-chip-side surface 14 of the light-emitting semiconductor chip 10, respectively. If the area of the photoluminescent layer 25 is substantially equal to the upper surface area of the light-emitting semiconductor chip 10, the first PL-side surface 251 and the second PL-side surface 252 may be substantially flush with the first semiconductor-chip-side surface 13 and the second semiconductor-chip-side surface 14, respectively.

The reflective structure 26 can include light scattering particles mixed in a light-transmitting resin material such that light is reflected back and is impeded from passing through the reflective structure 26. The reflective structure 26 covers the semiconductor-chip-side surfaces of the light-emitting semiconductor chip 10 and the PL-side surfaces 251 and 252 of the photoluminescent layer 25 along the first horizontal direction $D_1$ (as shown in FIG. 2A), but the reflective structure 26 does not cover, or exposes, the semiconductor-chip-side surfaces of the light-emitting semiconductor chip 10 and the photoluminescent layer 25 along the second horizontal direction $D_2$. The first reflective-structure-side surface 21 (hereinafter also referred to as the first package-side surface 21) and the second reflective-structure-side surface 22 (hereinafter also referred to as the second package-side surface 22) are disposed apart along the first horizontal direction $D_1$ of the reflective structure 26, and are the outermost side surfaces of the packaging structure 20, respectively. The reflective structure 26 can effectively reduce the viewing angle of the CSP LED A1 along the first horizontal direction $D_1$ while not affecting the viewing angle of the CSP LED A1 along the second horizontal direction $D_2$.

By visually recognizing from the bottom view the orientation of the first region $B_1$ (or the first package-length $L_1$) specified between the first package-side surface 21 and the first semiconductor-chip-side surface 13 and the second region $B_2$ (or the second package-length $L_2$) specified between the second package-side surface 22 and the second semiconductor-chip-side surface 14 by either human eyes or machine vision, the orientation of the electrode polarity can be identified. Alternatively, or in conjunction, along the first horizontal direction $D_1$, by visually recognizing from the top view the orientation of a third package-length $L_3$ specified between the first package-side surface 21 of the reflective structure 26 and the first PL-side surface 251 of the photoluminescent layer 25 and a fourth package-length $L_4$ specified between the second package-side surface 22 of the reflective structure 26 and the second PL-side surface 252 of the photoluminescent layer 25 by either human eyes or machine vision, the electrode polarity orientation can also be identified. In some embodiments, the CSP LED A1 can be specified such that if the first package-length $L_1$ is smaller than the second package-length $L_2$, then the third package-length $L_3$ is also correspondingly smaller than the fourth package-length $L_4$. Therefore, the length difference between the two characteristic package-lengths $L_3$ and $L_4$ (or the corresponding regional area difference) recognized from the top view by either human eyes or machine vision can also be used as an identifier of the orientation of the electrode polarity. It is noted that the two different package-lengths $L_3$ and $L_4$ also indicate that the reflective structure 26 comprises two portions of walls with different thicknesses. In addition, since the reflective structure 26 (for example, a white color) and the photoluminescent layer 25 (for example, a yellow color) exhibit different colors, it is more advantageous to use visual or machine vision to recognize the size difference between the two package-lengths $L_3$ and $L_4$ to identify the orientation of the electrode polarity.

On the other hand, the photoluminescent layer 25 is symmetrically and concentrically formed and disposed above and on the semiconductor-chip-side surfaces of the light-emitting semiconductor chip 10. Therefore, even if the reflective structure 26 has different thicknesses (e.g., package-lengths $L_3$ and $L_4$) on the opposite side along the horizontal direction $D_1$, it does not affect the optical properties of the CSP LED A1, such as the color coordinate, the radiation pattern, the viewing angle, or the luminous intensity.

In other embodiments, the reflective structure 26 can also cover the light-emitting semiconductor chip 10 and the photoluminescent layer 25 along the second horizontal direction $D_2$ (as shown in FIGS. 3A, 3B and 3C), wherein the light-emitting semiconductor chip 10 can be of a square shape or of a rectangular shape, and the semiconductor-chip-upper surface 11 and the semiconductor-chip-lower surface 12 thereof can be of a corresponding square shape (as shown in FIG. 3A), or of a rectangular shape (as shown in FIGS. 3B and 3C).

Figure 4B:
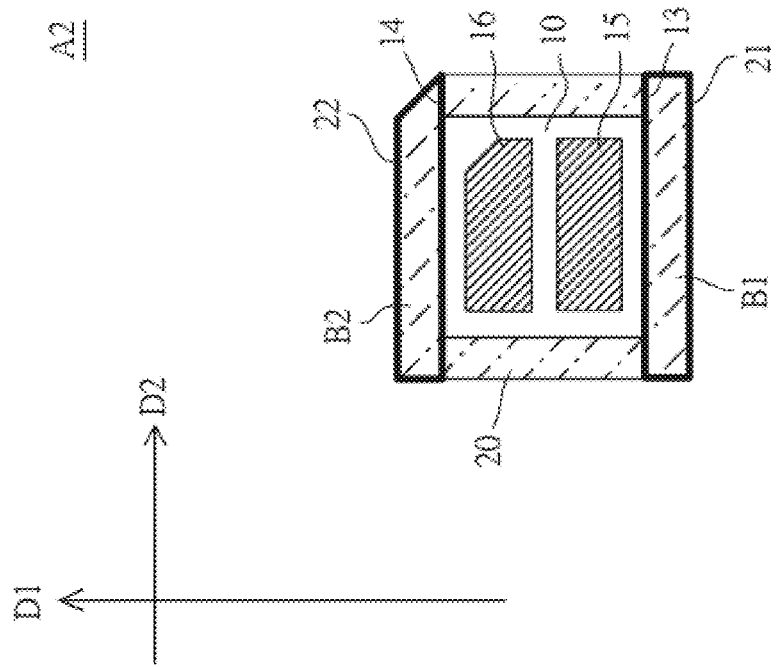
FIG. 4A and FIG. 4B are respectively a top view and a bottom view of a CSP LED according to another embodiment of the present disclosure.
Figure 4A:
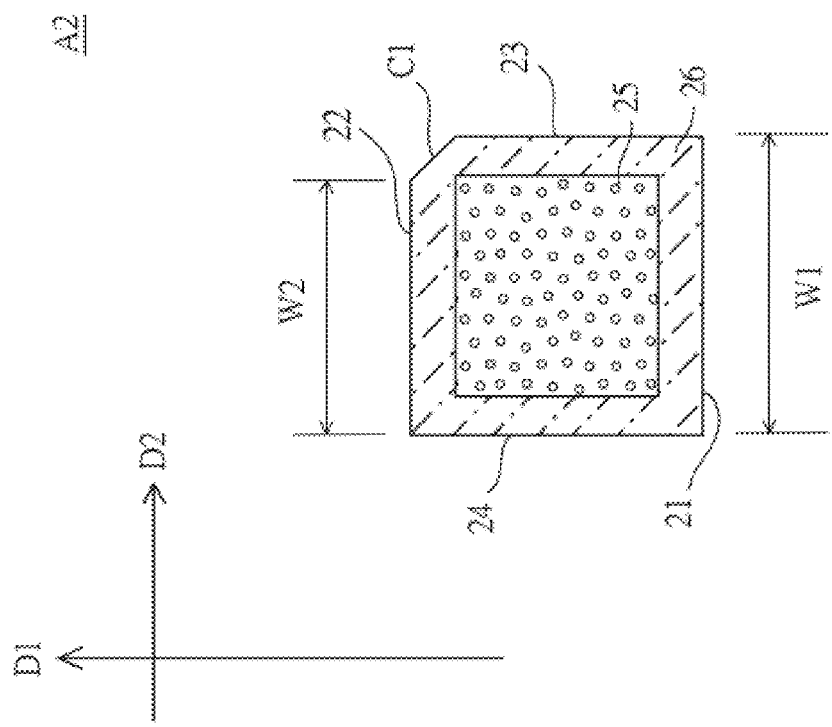

As illustrated in FIG. 4A and FIG. 4B are a top-view schematic diagram and a bottom-view schematic diagram of a CSP LED A2 according to another embodiment of the present disclosure. The CSP LED A2 also has a first region $B_1$ and a second region $B_2$ with different sizes of areas, which can be specified as an identifier to represent the orientation of the electrode polarity, wherein the area difference between the first region $B_1$ and the second region $B_2$ is characterized by the width difference of a first package-width $W_1$ and a second package-width $W_2$ of the packaging structure 20.

Specifically, as illustrated in FIGS. 4A and 4B, along the first horizontal direction $D_1$, the first package-width $W_1$ of the first package-side surface 21, which can be either the first packaging-structure-side surface 21 or the first reflective-structure-side surface 21, is greater than the second package-width $W_2$ of the second package-side surface 22, which can be either the second packaging-structure-side surface 22 or the second reflective-structure-side surface 22, so that the first region $B_1$ is specified to be larger than the second region $B_2$. The packaging structure 20 also includes a third package-side surface 23 that is spaced apart from a fourth package-side surface 24 along the second horizontal direction $D_2$. More specifically, the packaging structure 20 may also include a chamfered side surface $C_1$ that is connected between the second package-side surface 22 and the third package-side surface 23, wherein the second package-side surface 22 and the third package-side surface 23 are perpendicular but not directly connected to each other. However, the first package-side surface 21 is not directly connected to the chamfered side surface $C_1$ such that the first package-width $W_1$ of the first package-side surface 21 is relatively larger than the second package-width $W_2$ of the second package-side surface 22. In addition to including the chamfered side surface $C_1$, the packaging structure 20 may also include more than one chamfered side surface, such as including more than one rounded surface, and the packaging structure 20 may also include a recess (not shown) formed on the second package-side surface 22 so that the first region $B_1$ (or the first package-width $W_1$) and the second region $B_2$ (or the second package-width $W_2$) are visually different in terms of the region area.

Figure 5:
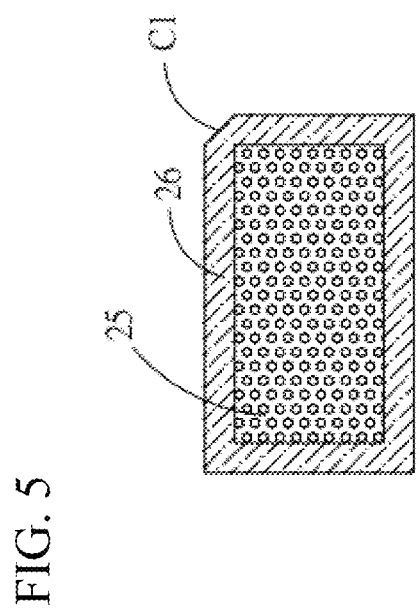
FIG. 5 is a top view showing another embodiment of the CSP LED illustrated in FIG. 4A.

In other embodiments, the reflective structure 26 may selectively cover the light-emitting semiconductor chip 10 and the photoluminescent layer 25 either along the first horizontal direction $D_1$ or along the second horizontal direction $D_2$, and the light-emitting semiconductor chip 10 may be of a rectangular shape (e.g., as shown in FIG. 5).

Although in the above example embodiments, the electrode polarity identifier is disposed along the first horizontal $D_1$ of the light-emitting semiconductor chip 10 (e.g., next to the first electrode 15 and/or the second electrode 16), it will be appreciated that these example embodiments shall not limit the possibility of other configurations. For example, the electrode polarity identifier can also be disposed along the second horizontal direction $D_2$ of the light-emitting semiconductor chip 10.

Figure 9:
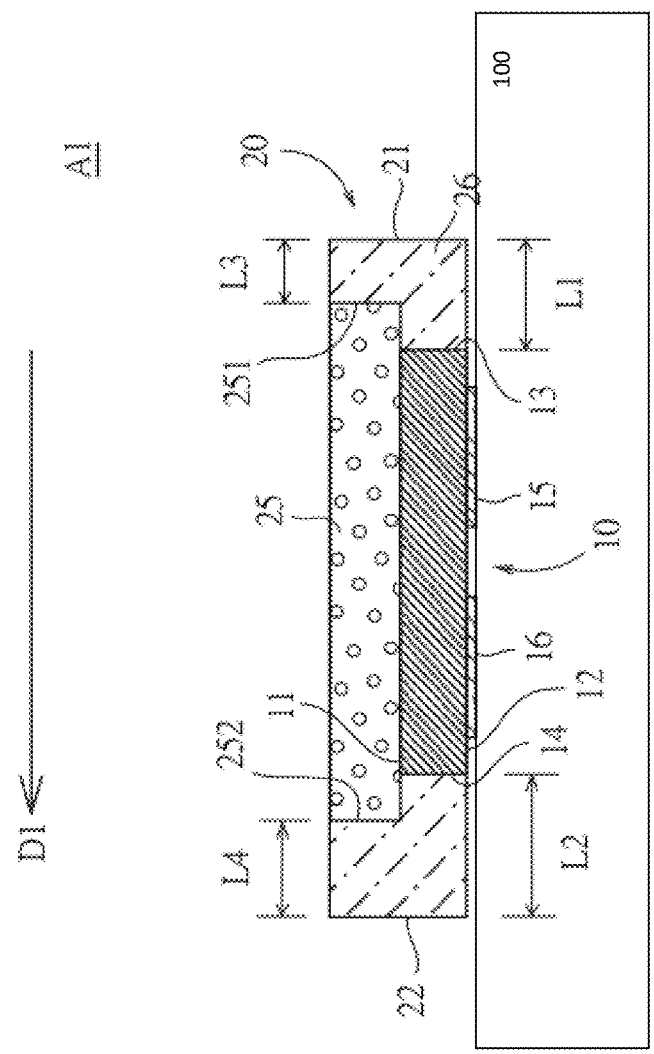
FIG. 9 is a schematic cross-sectional view of a CSP LED in accordance with another embodiment of the present disclosure.

It will further be appreciated that the technical feature of an electrode polarity identifier embodied with different region areas, or with different characteristic lengths, or with different characteristic widths on a packaging structure when it is viewed from the top side, can also be applied to another embodiment of a CSP LED with a submount substrate 100, wherein the light-emitting semiconductor chip 10 is electrically connected to the submount substrate 100 as illustrated in FIG. 9.

Next, a method of manufacturing CSP LEDs according to some embodiments of the present disclosure will be described, wherein the CSP LEDs of the same or similar configuration to the above-described embodiments A1 and A2 can be fabricated using the disclosed method. The technical details of the CSP LEDs described above can be referenced and applied to, and therefore the same descriptions will be omitted or simplified hereinafter.

Figure 6A:
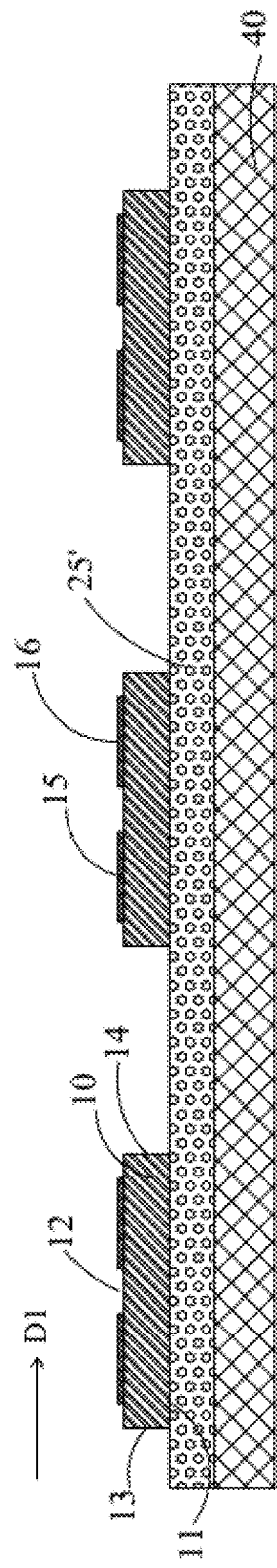
FIG. 6A, FIG. 6B, FIG. 6C, FIG. 6D, and FIG. 6E are schematic diagrams showing manufacturing stages of a method to fabricate a CSP LED according to an embodiment of the present disclosure.

As illustrated from FIG. 6A to FIG. 6E, a manufacturing method is illustrated with different fabrication stages. Specifically, the manufacturing method at least includes: providing a plurality of light-emitting semiconductor chips 10 (as shown in FIG. 6A); and forming a plurality of packaging structures 20 on the light-emitting semiconductor chips 10 (as shown from FIGS. 6B to 6E), wherein the packaging structure 20 has two regions of different sizes which can be used as an electrode polarity identifier for human eyes or machine vision to visually recognize the orientation of the electrode polarity.

Figure 6B:
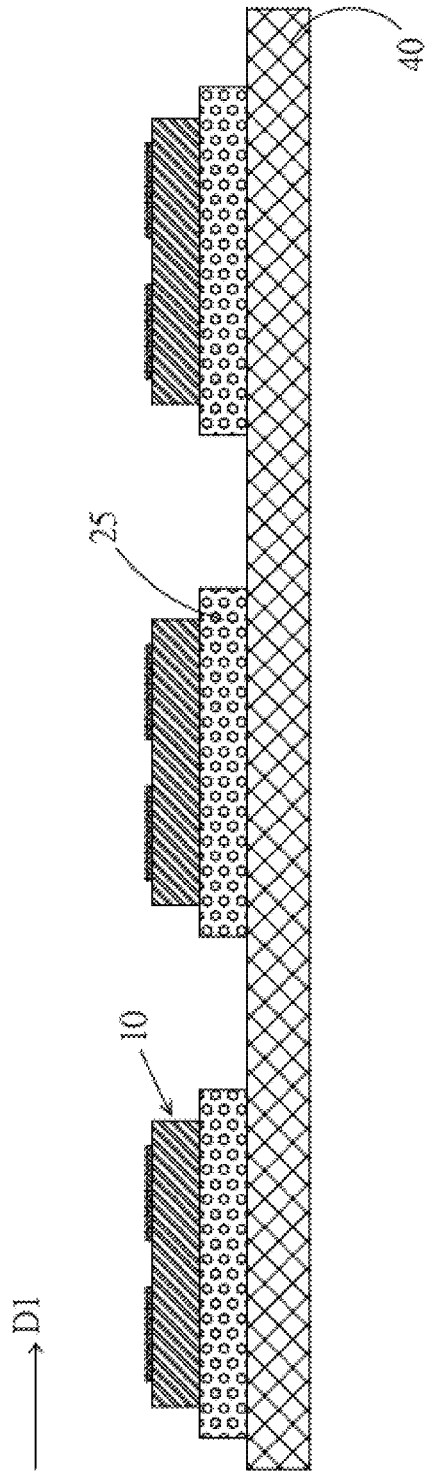
Figure 6C:
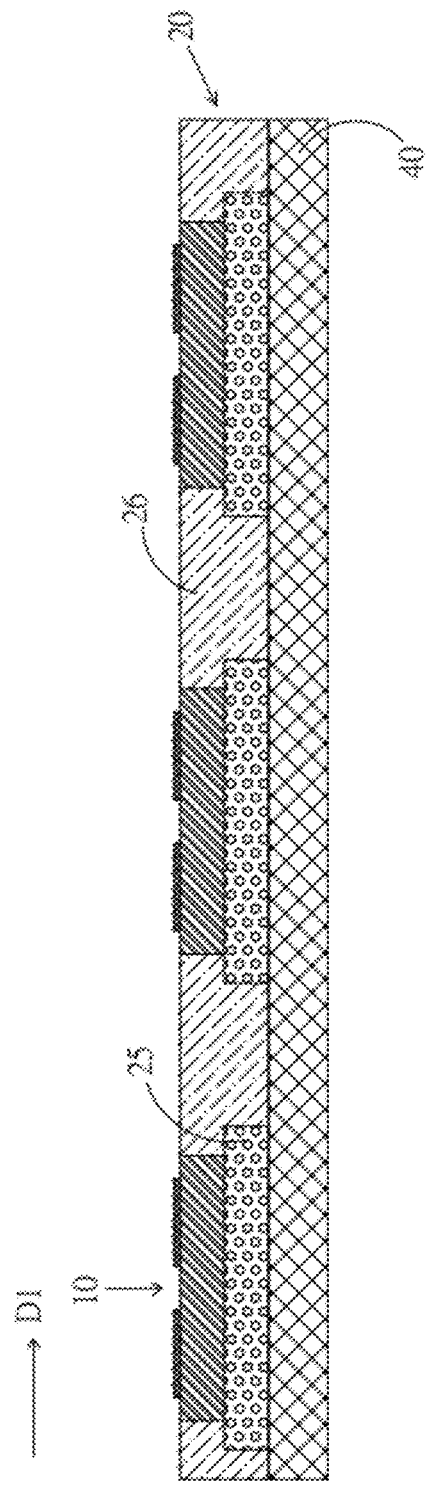

More specifically, as shown in FIG. 6A, a photoluminescent sheet 25' is first disposed on a release layer 40, and a plurality of light-emitting semiconductor chips 10 are disposed on the photoluminescent sheet 25'. The semiconductor-chip-upper surface 11 of each light-emitting semiconductor chip 10 is facing downward so as to be laminated and adhered to the photoluminescent sheet 25' to form an array of light-emitting semiconductor chips 10. As shown in FIG. 6B, portions of the photoluminescent sheet 25' are removed among the plurality of the light-emitting semiconductor chips 10 to form a plurality of the photoluminescent layers 25. Next, as illustrated in FIG. 6C is a fabrication stage of forming a plurality of the reflective structures 26 on the release layer 40, wherein the reflective structures 26 are disposed to fill the gaps among the separated photoluminescent layers 25 and among the separated light-emitting semiconductor chips 10. However, the reflective structures 26 do not cover the semiconductor-chip-lower surface 12 of each light-emitting semiconductor chip 10 so that the first electrode 15 and the second electrode 16 are exposed. At this fabrication stage, the reflective structure 26 and the photoluminescent layer 25 constitute a plurality of connected packaging structures 20.

Figure 6D:
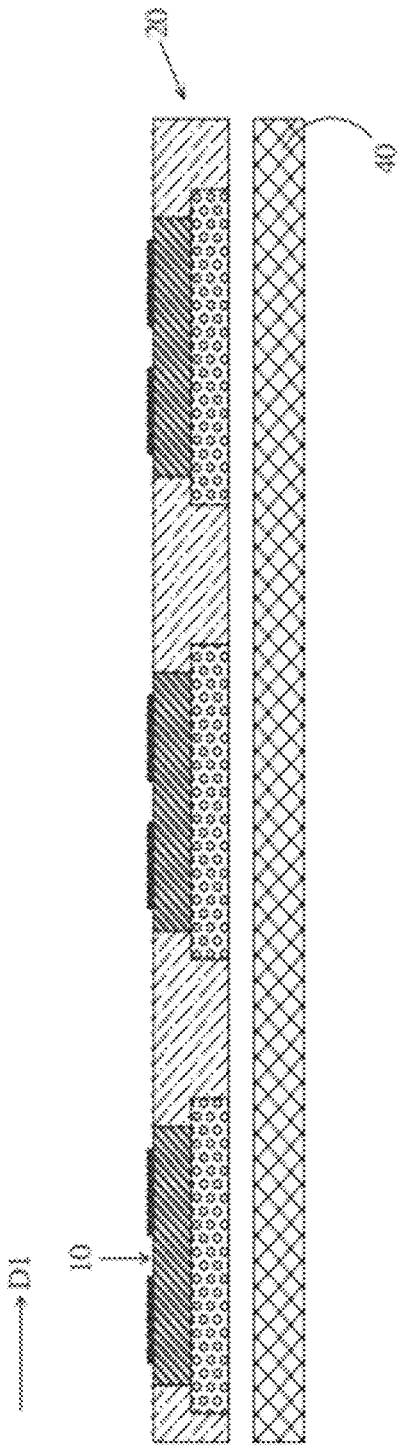
Figure 6E:
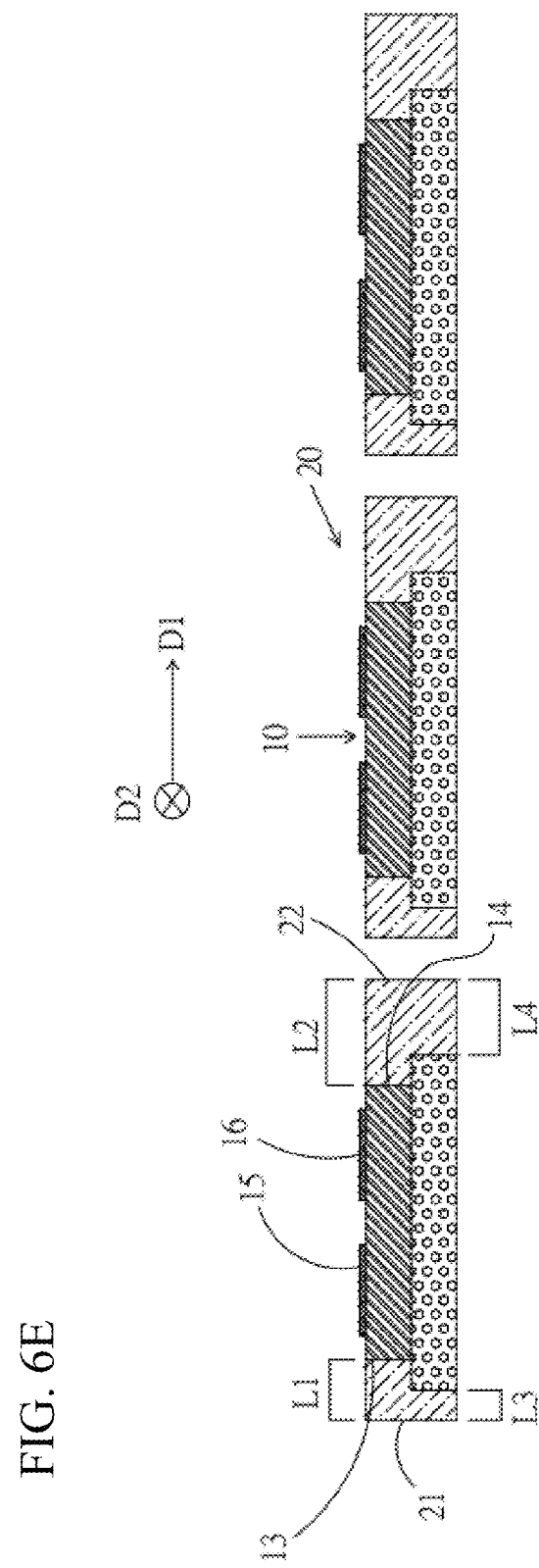

As shown in FIG. 6E, the packaging structures 20 connected to one another are cut along the first horizontal direction $D_1$ and along the second horizontal direction $D_2$ so that, for each of the packaging structures 20 when viewed along the first horizontal direction $D_1$, a first package-length $L_1$ specified between the first package-side surface 21 and the first semiconductor-chip-side surface 13 is made smaller than a second package-length $L_2$ specified between the second package-side surface 22 and the second semiconductor-chip-side surface 14. Correspondingly, a third package-length $L_3$ is made smaller than a fourth package-length $L_4$. In other words, the cutting position is not in the middle of the two connected packaging structures 20, but is biased toward one side of the packaging structures 20 along the first horizontal direction $D_1$. Thus, the CSP LED A1 of various embodiments as shown in FIGS. 1 to 3C can be formed. As shown in FIG. 6D, the release layer 40 can be removed before or after the packaging structures 20 are cut.

Figure 7B:
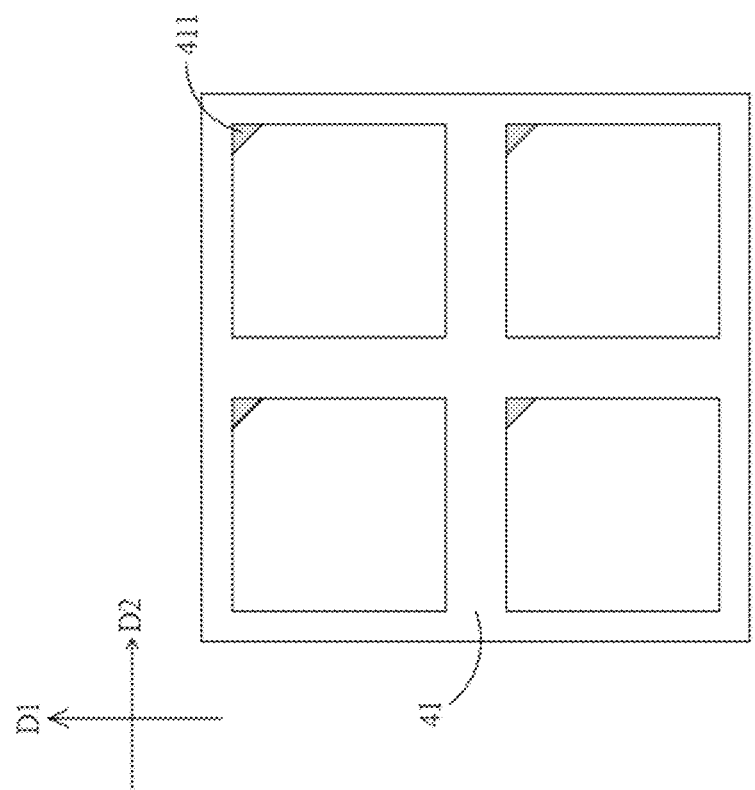
FIG. 7A and FIG. 7B are schematic diagrams showing manufacturing stages of a method to fabricate a CSP LED according to another embodiment of the present disclosure.
Figure 7A:
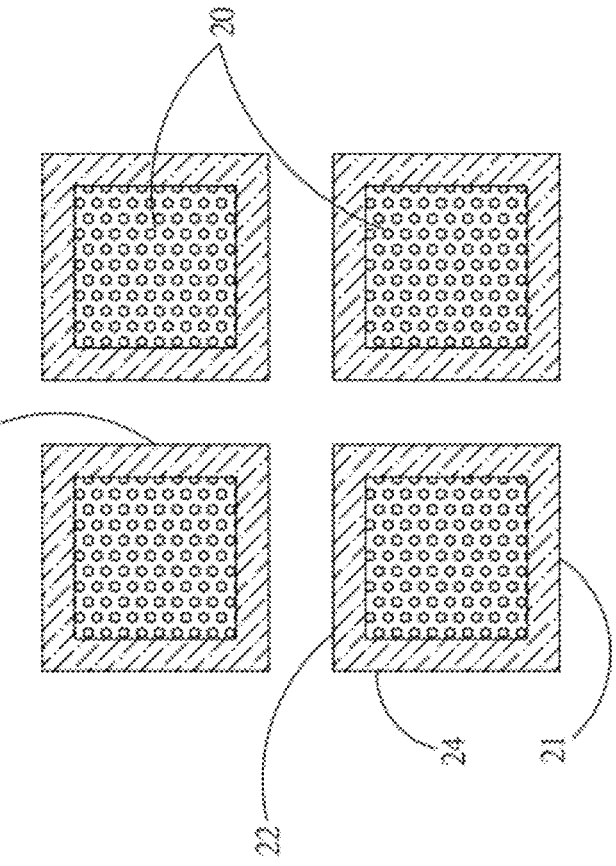

In another embodiment, a method of forming the packaging structures 20 may include: cutting the packaging structures 20 along the first horizontal direction $D_1$ (as shown in FIG. 7A) such that each of the packaging structures 20 forms a first package-side surface 21 and a second package-side surface 22 which are disposed apart from each other, and cutting the packaging structures 20 along the second horizontal direction $D_2$ (also shown in FIG. 7A) such that each of the packaging structures 20 forms a third package-side surface 23 and a fourth package-side surface 24 which are disposed apart from each other along the second horizontal direction $D_2$. Thus, the plurality of the packaging structures 20 can be separated by the cutting process. Next, as shown in FIG. 7B, a chamfered side surface $C_1$ (as shown in FIG. 4A) can be formed on each of the packaging structures 20 by a punching mold 41. Thus, the CSP LED A2 of various embodiments as shown in FIG. 4A, FIG. 4B, and FIG. 5 can be formed.

In addition, the punching mold 41 includes a plurality of corner-cutting blades 411 which are obliquely disposed relative to the first horizontal direction $D_1$ and the second horizontal direction $D_2$. When a punching process is performed, each corner of the packaging structures 20 can be removed by the corresponding corner-cutting blade 411 so that a chamfered side surface $C_1$ is formed at each corner of the packaging structure 20. In other embodiments, the punching mold 41 can include a plurality of annular four-side cutting blades, each of which is corresponding to the first package-side surface 21, the second package-side surface 22, the third package-side surface 23, and the fourth package-side surface 24, which can be used to separate the connected packaging structures 20 by a single punch (as shown in FIG. 7A). A chamfered side surface $C_1$ can be simultaneously formed on the packaging structure 20 using this punching mold 41.

Figure 8A:
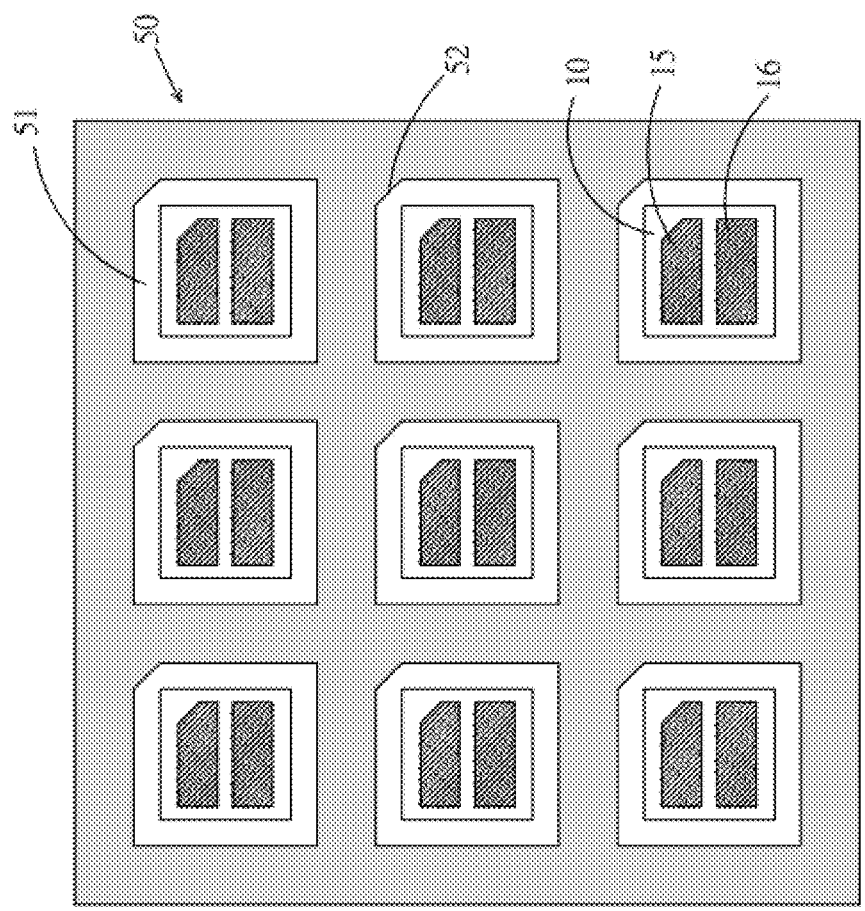
FIG. 8A and FIG. 8B are schematic diagrams showing a manufacturing method to fabricate a CSP LED according to another embodiment of the present disclosure.
Figure 8B:
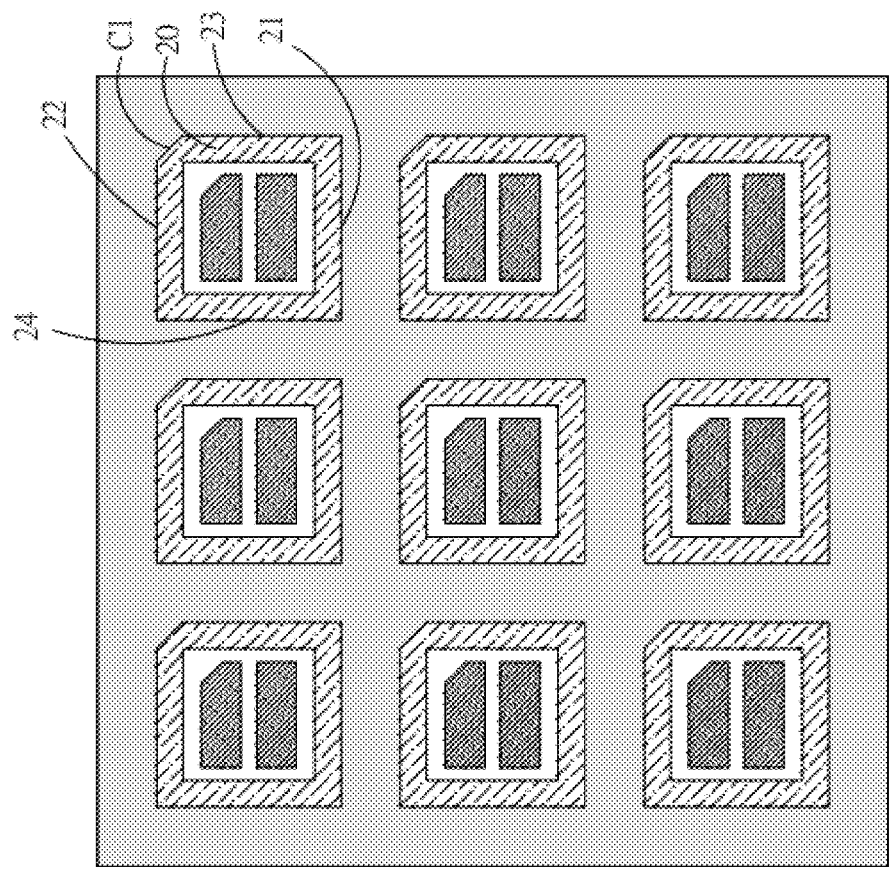
Figure 8B:
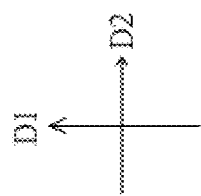

In another embodiment, a mold 50 comprises a plurality of mold cavities 50. The fabrication stage of forming the packaging structures 20 may further include: placing a plurality of light-emitting semiconductor chips 10 in a plurality of mold cavities 51 inside the mold 50, as shown in FIG. 8A, wherein each of the mold cavities 51 includes a chamfered side surface 52. In addition, a photoluminescent layer 25 (as shown in FIG. 4A) is disposed on the light-emitting semiconductor chip 10, and both are subsequently disposed inside the mold cavity 51. Next, as shown in FIG. 8B, each of packaging structures 20 including the reflective structure 26 is formed in each corresponding mold cavity 51, so that the reflective structure 26 is formed with a shape corresponding to the mold cavity 51. Since each mold cavity 51 has a chamfered side surface 52 at one corner, the reflective structure 26 fabricated using the mold 50 with the mold cavity 51 also has a chamfered side surface $C_1$. Thus, the CSP LED A2 of various embodiments as shown in FIG. 4A, FIG. 4B, and FIG. 5 can be formed.

The mold cavity 51 can also be specified to not include a chamfered side surface 52. That is, the mold cavity 51 can be specified with a square shape or a rectangular shape. When a plurality of light-emitting semiconductor chips 10 are disposed with an offset along the first horizontal direction $D_1$ (e.g., the light-emitting semiconductor chip 10 is not disposed concentric with the mold cavity 51), a package-length $L_1$ between the first package-side surface 21 and the first semiconductor-chip-side surface 13 is made smaller than a second package-length $L_2$ between the second package-side surface 22 and the second semiconductor-chip-side surface 14 (or a third package-length $L_3$ corresponding to the first package-length $L_1$ is made smaller than a fourth package-length $L_4$ corresponding to the second package-length $L_2$). Using this manufacturing method, a CSP LED A1 of various embodiments as shown in FIG. 1 to FIG. 3C can be fabricated.

In summary, a CSP LED of some embodiments of the present disclosure can be fabricated with a polarity identifier for human eyes or machine vision to visually recognize the electrode polarity orientation of the CSP LED. Furthermore, no additional manufacturing process is included to fabricate the electrode polarity identifier in addition to forming or singulating a packaging structure. Therefore, the fabrication method according to some embodiments of the present disclosure will not adversely affect a manufacturing yield, and the electrode polarity identifier according to some embodiments of the present disclosure effectively solves the problem of identifying a component orientation of a CSP LED in a streamlined manner.

While the disclosure has been described with reference to the specific embodiments thereof, it should be understood by those skilled in the art that various changes may be made and equivalents may be substituted without departing from the true spirit and scope of the disclosure as defined by the appended claims. In addition, many modifications may be made to adapt a particular situation, material, composition of matter, method, or process to the objective, spirit and scope of the disclosure. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the disclosure. Accordingly, unless specifically indicated herein, the order and grouping of the operations are not limitations of the disclosure.

What is claimed is:

1. A chip-scale packaging light-emitting device comprising:
    a light-emitting semiconductor chip comprising a semiconductor-chip-upper surface, a semiconductor-chip-lower surface opposite to the semiconductor-chip-upper surface, a first semiconductor-chip-side surface, a second semiconductor-chip-side surface, a first electrode and a second electrode, wherein a first horizontal direction and a perpendicular second horizontal direction are specified on the semiconductor-chip-upper surface, the first semiconductor-chip-side surface and the second semiconductor-chip-side surface extend between the semiconductor-chip-upper surface and the semiconductor-chip-lower surface, the first semiconductor-chip-side surface and the second semiconductor-chip-side surface are disposed apart along the first horizontal direction, and the first electrode and the second electrode are disposed adjacent to the semiconductor-chip-lower surface, and adjacent to the first semiconductor-chip-side surface and the second semiconductor-chip-side surface, respectively; and
    a packaging structure comprising a light transmitting structure and covering the semiconductor-chip-upper surface, the first semiconductor-chip-side surface and the second semiconductor-chip-side surface, but exposing the semiconductor-chip-lower surface, the first electrode and the second electrode, wherein light is emitted outwardly through the light transmitting structure, and wherein the light transmitting structure of the packaging structure comprises a first packaging-structure-side surface and a second packaging-structure-side surface disposed apart along the first horizontal direction, and wherein the first packaging-structure-side surface and the second packaging-structure-side surface are outermost side surfaces of the packaging structure;
    wherein a first region of the packaging structure is between the first packaging-structure-side surface and the first semiconductor-chip-side surface adjacent to the first electrode, a second region of the packaging structure is between the second packaging-structure-side surface and the second semiconductor chip-side surface adjacent to the second electrode, and wherein with respect to a projection from a top view or a bottom view of the packaging structure, the first region and the second region both have a same rectangular shape in appearance but a rectangular area of the first region is different from a rectangular area of the second region.

2. The light-emitting device of claim 1, wherein, along the first horizontal direction, a first package-length between the first packaging-structure-side surface and the first semiconductor-chip-side surface is smaller than a second package-length between the second packaging-structure-side surface and the second semiconductor-chip-side surface, such that the first region is smaller than the second region.

3. The light-emitting device of claim 2, wherein the second package-length is at least 1.2 times of the first package-length.

4. The light-emitting device of claim 1, further comprising a submount substrate, and the light-emitting semiconductor chip is electrically connected to the submount substrate.

5. A plurality of chip-scale packaging light-emitting devices, each chip-scale packaging light-emitting device comprising:
    a light-emitting semiconductor chip comprising a semiconductor-chip-upper surface, a semiconductor-chip-lower surface opposite to the semiconductor-chip-upper surface, a first semiconductor-chip-side surface, a second semiconductor-chip-side surface, a first electrode and a second electrode, wherein a first horizontal direction and a perpendicular second horizontal direction are specified on the semiconductor-chip-upper surface, the first semiconductor-chip-side surface and the second semiconductor-chip-side surface extend between the semiconductor-chip-upper surface and the semiconductor-chip-lower surface, the first semiconductor-chip-side surface and the second semiconductor-chip-side surface are disposed apart along the first horizontal direction, and the first electrode and the second electrode are disposed adjacent to the semiconductor-chip-lower surface; and
    a packaging structure covering the semiconductor-chip-upper surface, the first semiconductor-chip-side surface and the second semiconductor-chip-side surface, but exposing the semiconductor-chip-lower surface, the first electrode and the second electrode, wherein the packaging structure further comprises a photoluminescent layer and a reflective structure, the photoluminescent layer is disposed on the semiconductor-chip-upper surface of the light-emitting semiconductor chip and comprises a first photoluminescent-layer-side surface and a second photoluminescent-layer-side surface disposed apart along the first horizontal direction, the reflective structure covers the first semiconductor-chip-side surface, the second semiconductor-chip-side surface, the first photoluminescent-layer-side surface and the second photoluminescent-layer-side surface, and the reflective structure comprises a first reflectivestructure-side surface and a second reflective-structure-side surface disposed apart along the first horizontal direction;
wherein a first region of the packaging structure is between the first reflective-structure-side surface and the first photoluminescent-layer-side surface and adjacent to the first electrode, a second region of the packaging structure is between the second reflective-structure-side surface and the second photoluminescent-layer-side surface and adjacent to the second electrode, and
wherein the plurality of chip-scale packaging light-emitting devices are separated by biased and off-center singulation cuts between adjacent chip-scale packaging light-emitting devices in the first horizontal direction such that an area of the first region is smaller than an area of the second region in each of the chip-scale packaging light-emitting devices so as to visually distinguish the first region from the second region and to assist in consistently distinguishing the first electrode from the second electrode of each of the chip-scale packaging light-emitting devices.

6. The light-emitting device of claim 5, wherein, along the first horizontal direction, a third package-length between the first reflective-structure-side surface and the first photoluminescent-layer-side surface is smaller than a fourth package-length between the second reflective-structure-side surface and the second photoluminescent-layer-side surface.

7. The light-emitting device of claim 5, wherein, along the second horizontal direction, a first package-width of the first reflective-structure-side surface is greater than a second package-width of the second reflective-structure-side surface.

8. The light-emitting device of claim 5, further comprising a submount substrate, and the light-emitting semiconductor chip is electrically connected to the submount substrate.

9. The light-emitting device of claim 5, wherein the light-emitting semiconductor chip further comprises a third semiconductor-chip-side surface and a fourth semiconductor-chip-side surface disposed apart along the second horizontal direction, and the reflective structure further covers the third semiconductor-chip-side surface and the fourth semiconductor-chip-side surface.

10. A method of manufacturing a chip-scale packaging light-emitting device comprising:
providing a light-emitting semiconductor chip, wherein the light-emitting semiconductor chip comprises a semiconductor-chip-upper surface, a semiconductor-chip-lower surface opposite to the semiconductor-chip-upper surface, a first semiconductor-chip-side surface, a second semiconductor-chip-side surface, a first electrode and a second electrode, wherein a first horizontal direction and a perpendicular second horizontal direction are specified on the semiconductor-chip-upper surface, the first semiconductor-chip-side surface and the second semiconductor-chip-side surface extend between the semiconductor-chip-upper surface and the semiconductor-chip-lower surface, the first semiconductor-chip-side surface and the second semiconductor-chip-side surface are disposed apart along the first horizontal direction, and the first electrode and the second electrode are disposed adjacent to the semiconductor-chip-lower surface, and adjacent to the first semiconductor-chip-side surface and the second semiconductor-chip-side surface, respectively; and
forming a packaging structure comprising a light transmitting structure on the light-emitting semiconductor chip, wherein the packaging structure covers the semiconductor-chip-upper surface, the first semiconductor-chip-side surface and the second semiconductor-chip-side surface, but exposes the semiconductor-chip-lower surface, the first electrode and the second electrode;
wherein the light transmitting structure of the packaging structure comprises a first package-side surface and a second package-side surface disposed apart along the first horizontal direction, wherein the first packaging-structure-side surface and the second packaging-structure-side surface are outermost side surfaces of the packaging structure, and wherein a first region is between the first package-side surface and the first semiconductor-chip-side surface adjacent to the first electrode, a second region is between the second package-side surface and the second semiconductor-chip-side surface adjacent to the second electrode, and wherein with respect to a projection from a top view or a bottom view of the packaging structure, the first region and the second region both have a rectangular shape in appearance but a rectangular area of the first region is different from a rectangular area of the second region.

11. The method of claim 10, wherein forming the packaging structure comprises:
cutting the packaging structure such that, along the first horizontal direction, a first package-length between the first package-side surface and the first semiconductor-chip-side surface is smaller than a second package-length between the second package-side surface and the second semiconductor-chip-side surface.

12. The light-emitting device of claim 1, wherein the packaging structure further includes phosphor materials or quantum dot materials mixed in the light transmitting structure.

13. The method of claim 10, wherein the packaging structure further includes phosphor materials or quantum dot materials mixed in the light transmitting structure.

* * * * *